United States Patent
Lee et al.

(10) Patent No.: US 9,847,371 B2
(45) Date of Patent: Dec. 19, 2017

(54) LIGHT EMITTING DIODE CHIP FOR HIGH VOLTAGE OPERATION AND LIGHT EMITTING DIODE PACKAGE INCLUDING THE SAME

(75) Inventors: Chung Hoon Lee, Ansan-si (KR); Won Cheol Seo, Ansan-si (KR); Yeo Jin Yoon, Ansan-si (KR); Jin Cheol Shin, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 495 days.

(21) Appl. No.: 13/146,073

(22) PCT Filed: Feb. 12, 2010

(86) PCT No.: PCT/KR2010/000892
§ 371 (c)(1),
(2), (4) Date: Jul. 25, 2011

(87) PCT Pub. No.: WO2010/093190
PCT Pub. Date: Aug. 19, 2010

(65) Prior Publication Data
US 2011/0284884 A1 Nov. 24, 2011

(30) Foreign Application Priority Data
Feb. 12, 2009 (KR) .................. 10-2009-0011325

(51) Int. Cl.
*H01L 27/15* (2006.01)
*H01L 33/62* (2010.01)
(Continued)

(52) U.S. Cl.
CPC ....... *H01L 27/153* (2013.01); *H05B 33/0821* (2013.01); *H01L 33/62* (2013.01);
(Continued)

(58) Field of Classification Search
CPC ............... H01L 27/153; H01L 33/62; H01L 2224/48091; H01L 2224/48137; H01L 2924/00014; H05B 33/0821
(Continued)

(56) References Cited

U.S. PATENT DOCUMENTS 4,271,408 A * 6/1981 Teshima ................. G08G 1/095
340/815.45
6,864,999 B1 * 3/2005 Fujimoto et al. ............. 358/472
(Continued)

FOREIGN PATENT DOCUMENTS

JP 2009-4789 1/2009
WO 2004-023568 3/2004
(Continued)

OTHER PUBLICATIONS

Written Opinion of PCT/KR2010/000892 dated Sep. 29, 2010.
Korean Office Action dated May 18, 2015, in Korean Application No. 10-2009-0011325.

*Primary Examiner* — Johannes P Mondt
(74) *Attorney, Agent, or Firm* — H.C. Park & Associates, PLC

(57) ABSTRACT

A light emitting diode (LED) chip for high voltage operation and an LED package including the same are disclosed. The LED chip includes a substrate, a first array formed on the substrate and including n light emitting cells connected in series, and a second array formed on the substrate and including m (m≤n) light emitting cells connected in series. During operation of the LED chip, the first array and the second array are operated by being connected in reverse parallel to each other. Further, when a driving voltage of the first array is defined as Vd1 and a driving voltage of the second array is defined as Vd2, a difference between Vd1 and Vd2×(n/m) is not more than 2V.

10 Claims, 11 Drawing Sheets

(51) Int. Cl.
*H01L 33/50* (2010.01)
*H05B 33/08* (2006.01)

(52) U.S. Cl.
CPC ............... *H01L 2224/48091* (2013.01); *H01L 2224/48137* (2013.01)

(58) Field of Classification Search
USPC ............................... 257/88, 98, 99, E33.055
See application file for complete search history.

(56) References Cited

U.S. PATENT DOCUMENTS

| | | |
|---|---|---|
| 7,417,259 B2 | 8/2008 | Sakai et al. |
| 8,173,459 B2 | 5/2012 | Kim et al. |
| 2008/0179602 A1* | 7/2008 | Negley et al. ................... 257/88 |
| 2009/0033211 A1* | 2/2009 | Tanabe et al. ................. 313/504 |
| 2010/0084990 A1* | 4/2010 | Ang et al. ...................... 315/291 |

FOREIGN PATENT DOCUMENTS

| | | | |
|---|---|---|---|
| WO | 2008/075797 | 6/2008 | |
| WO | WO-2008-075797 A1 * | 6/2008 | ............. H01L 33/00 |

* cited by examiner

[Figure 1]
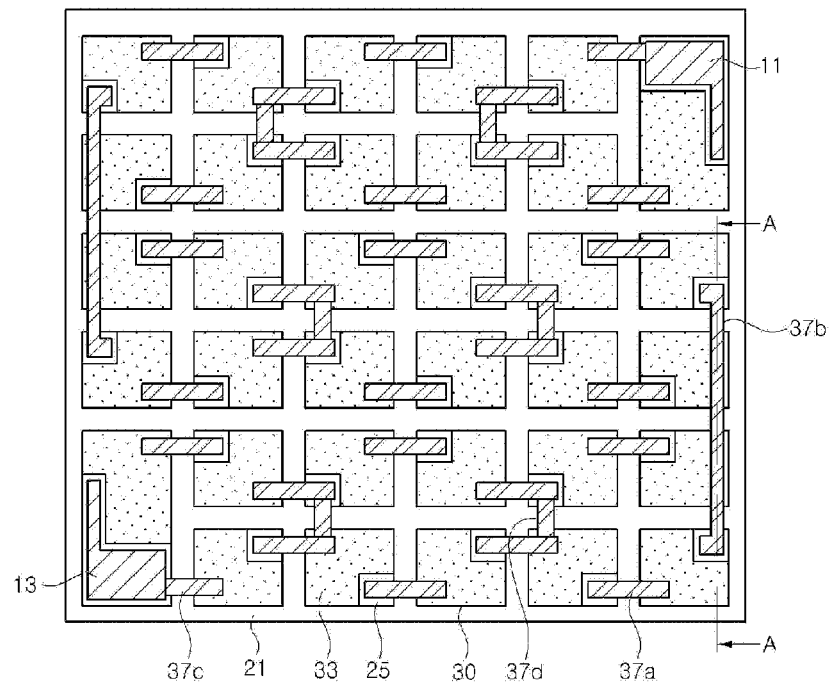
[Figure 2]
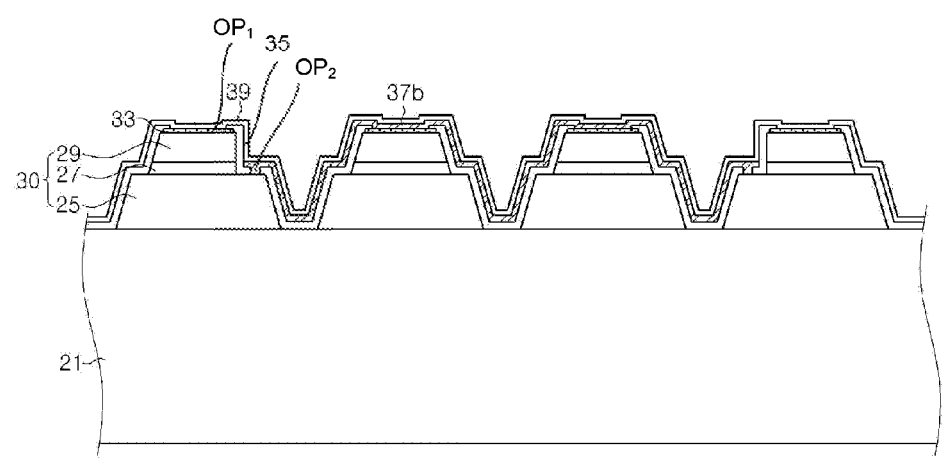

【Figure 3】
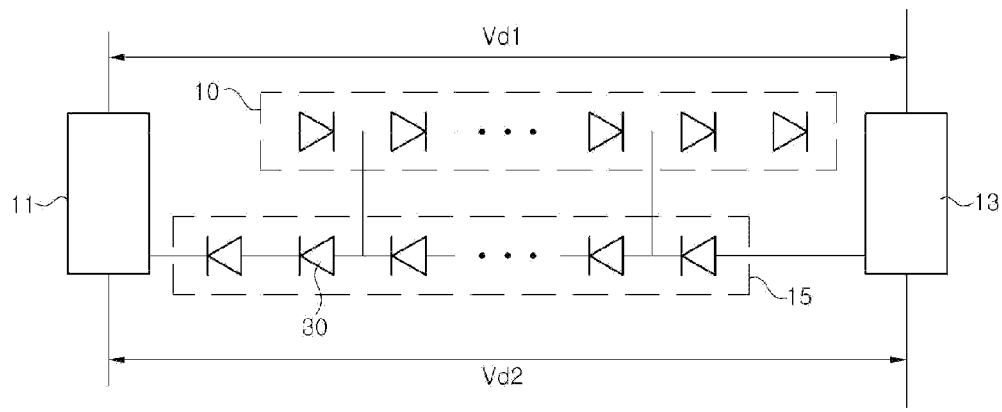
【Figure 4】
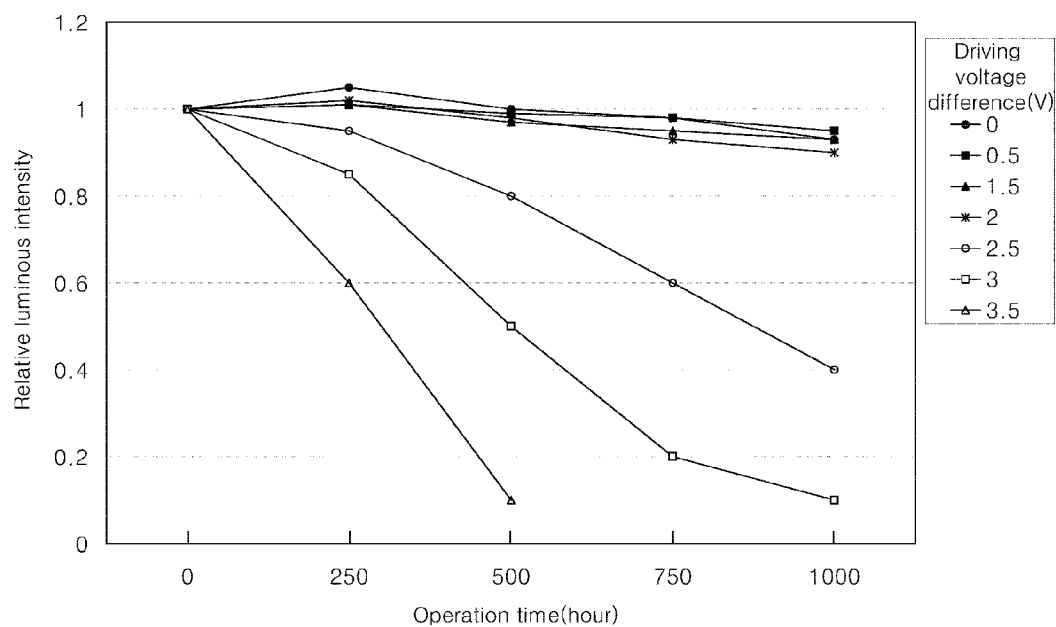

[Figure 5]
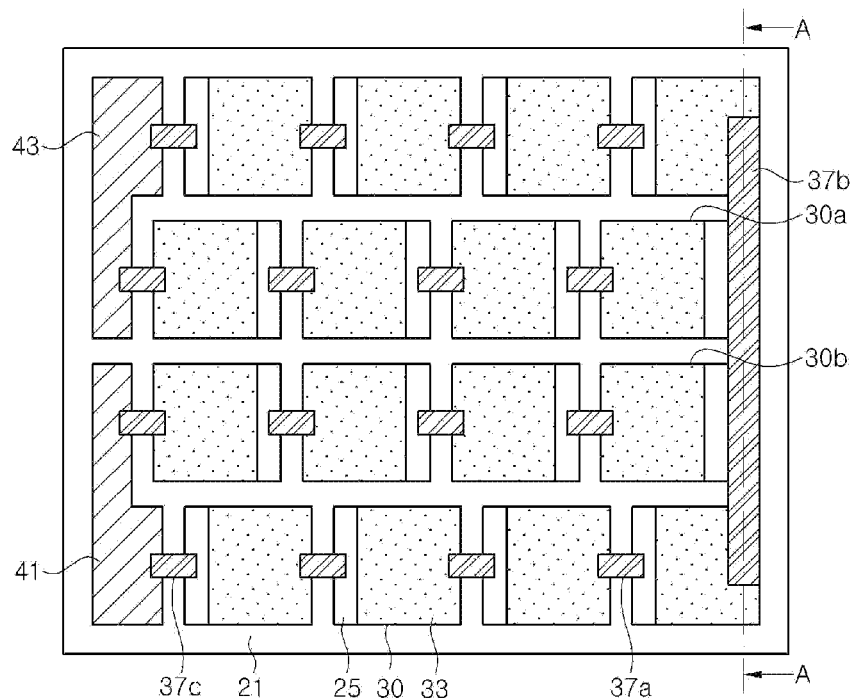
[Figure 6]
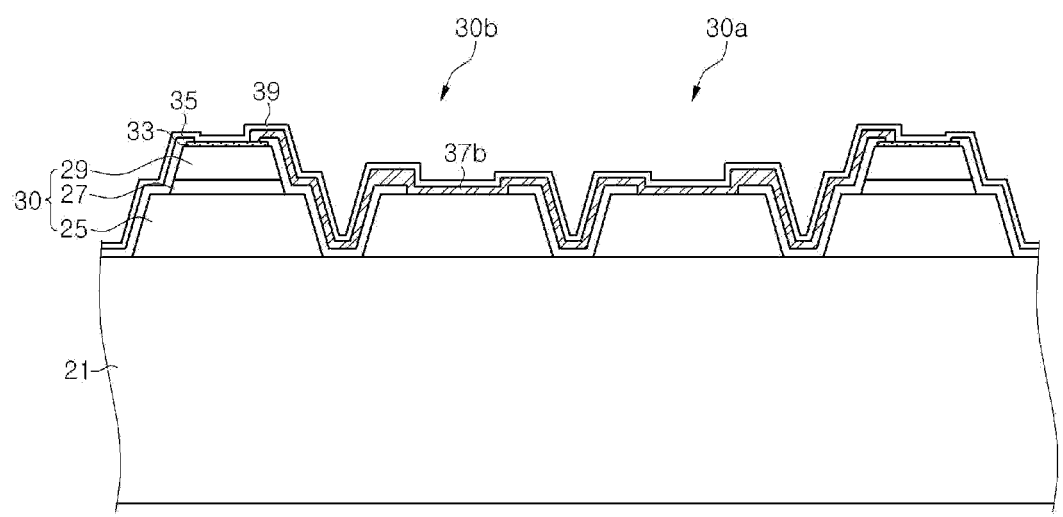

[Figure 7]
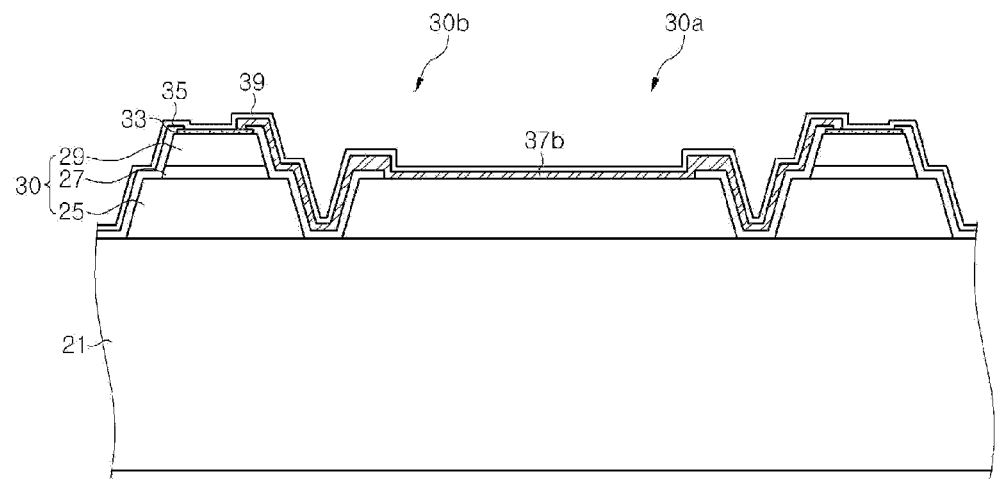
[Figure 8]
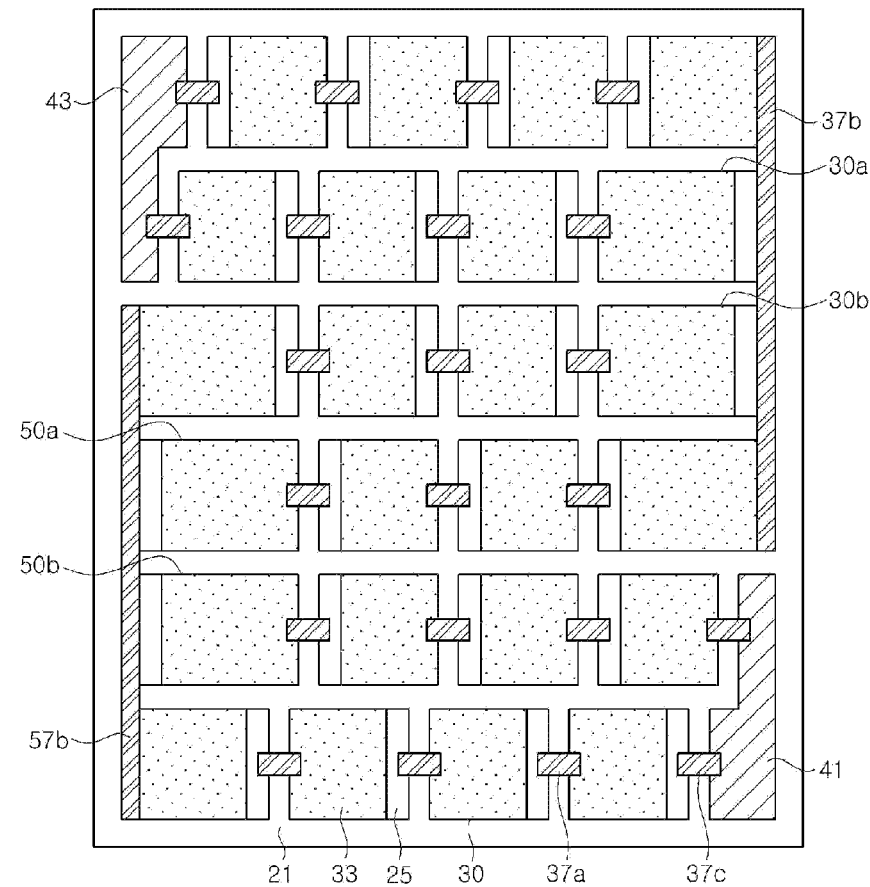

[Figure 9]
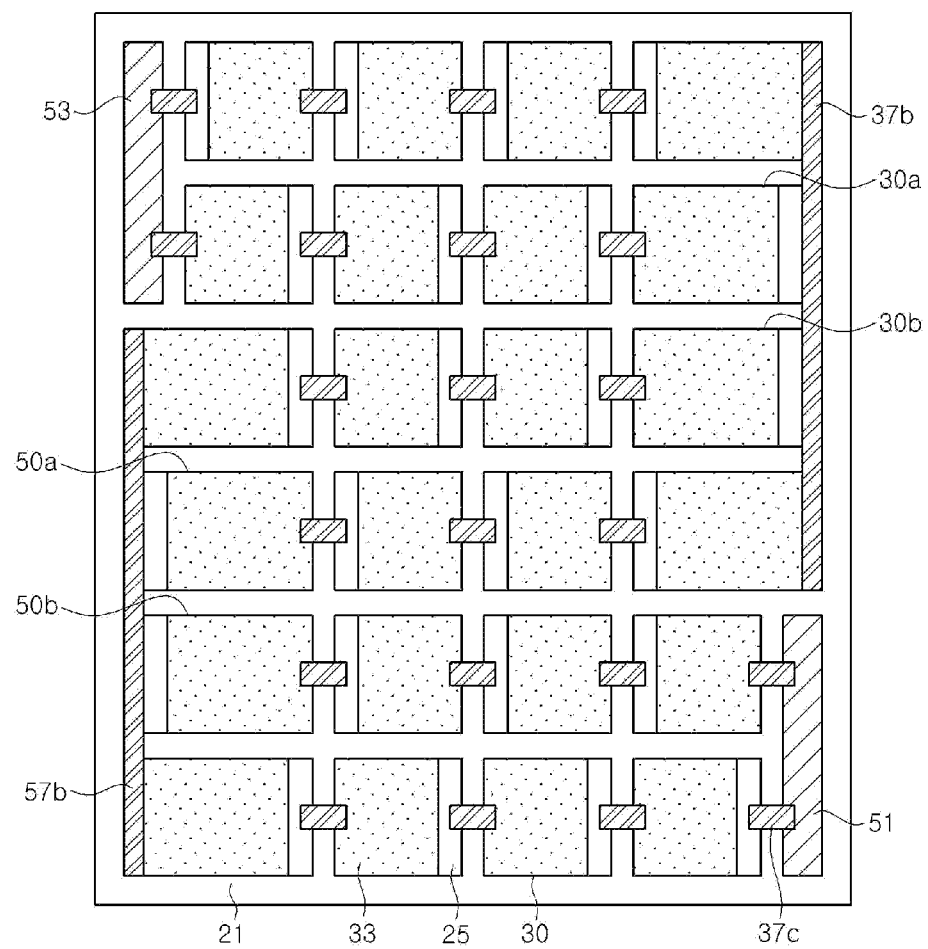

【Figure 10】
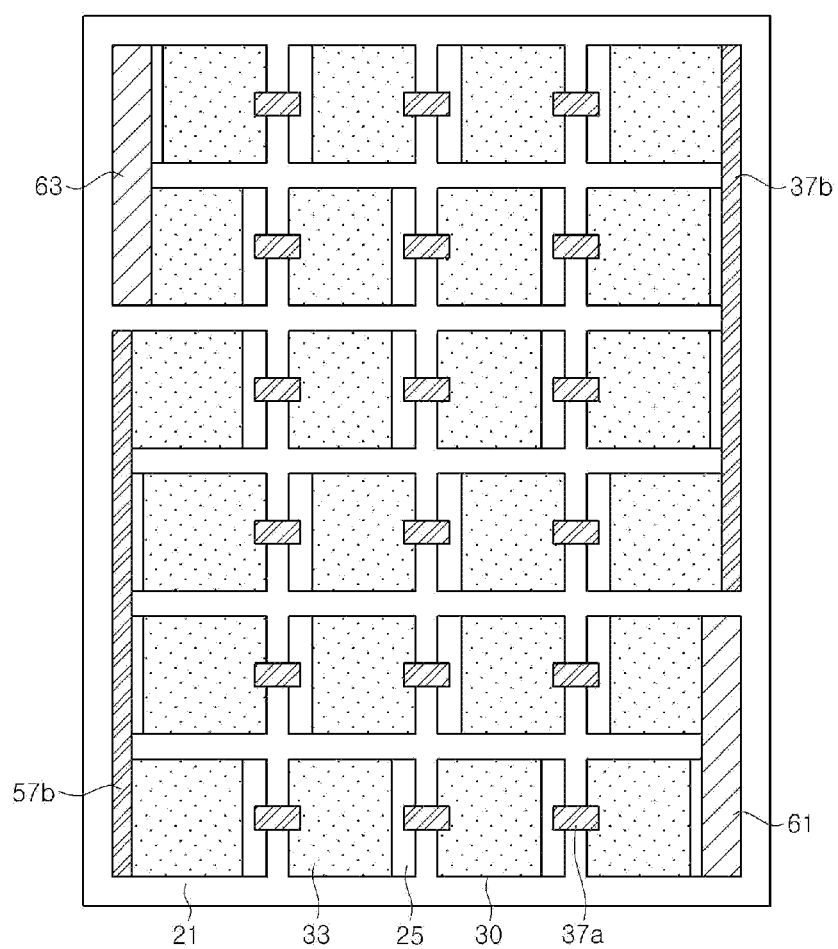

【Figure 11】
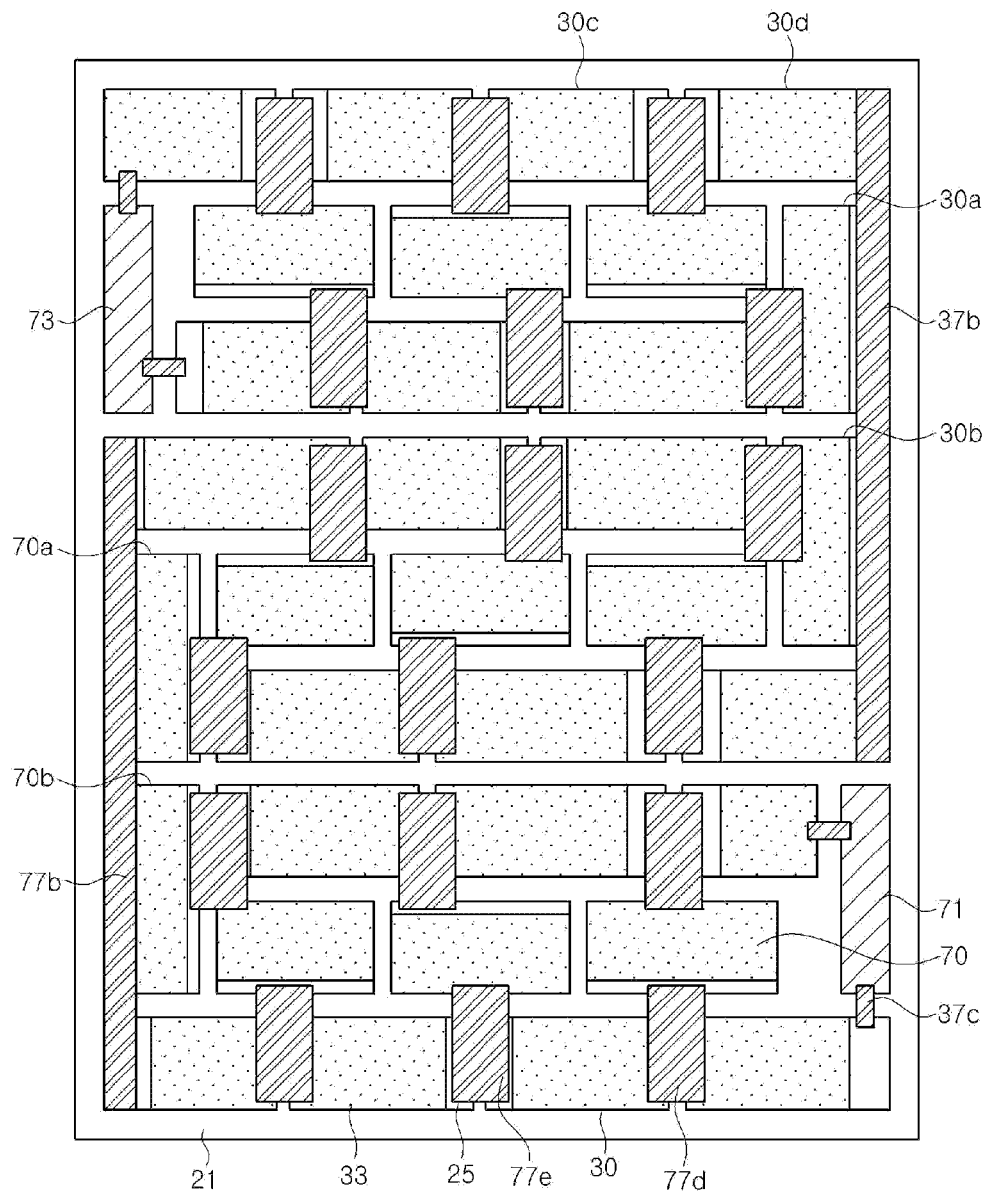

【Figure 12】
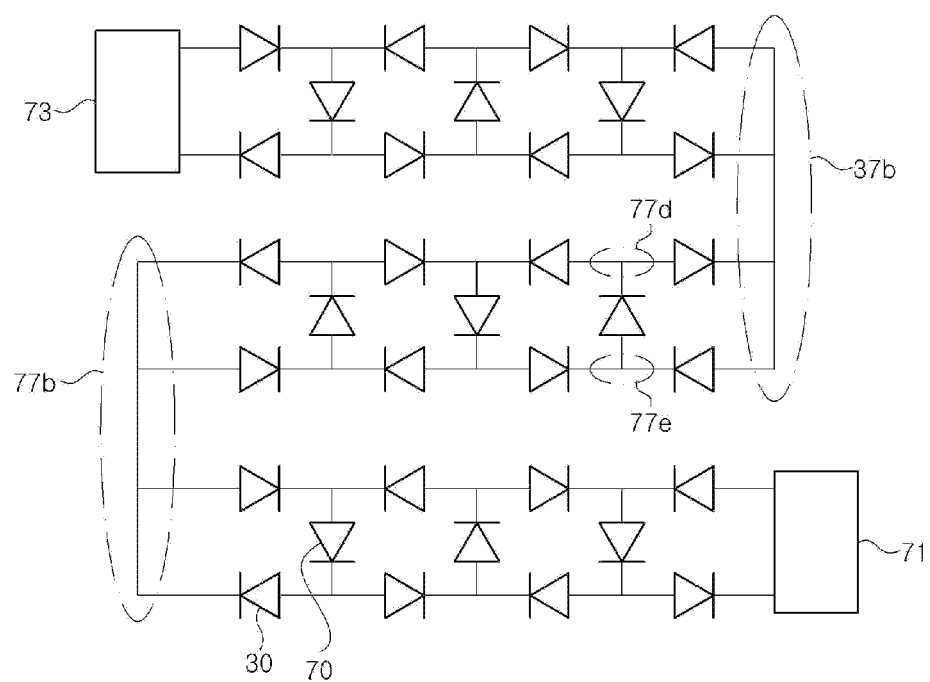

[Figure 13]
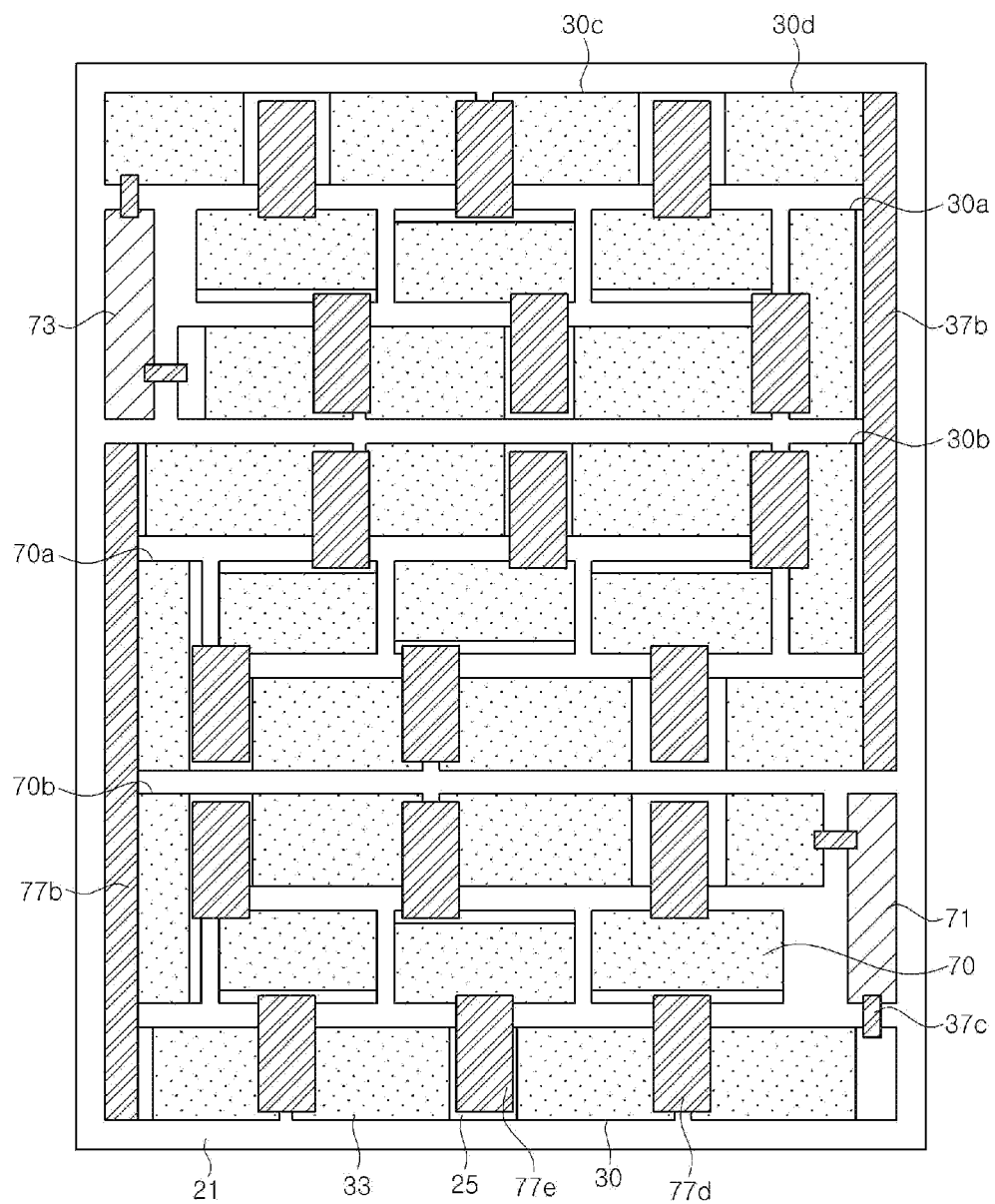

【Figure 14】
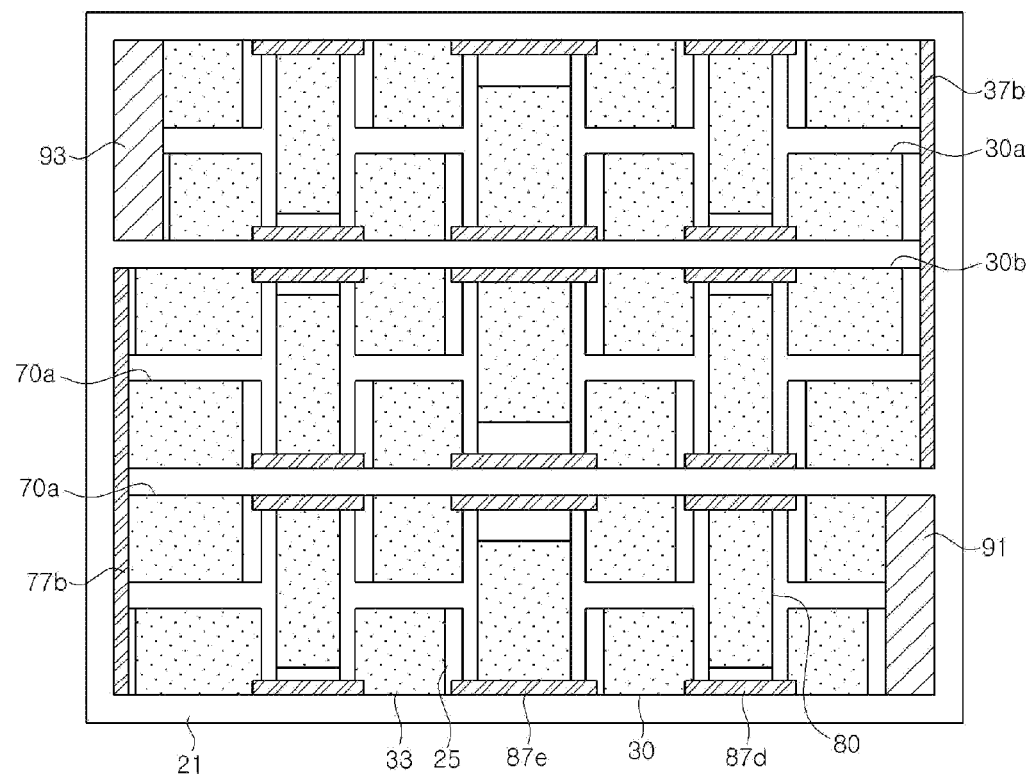
【Figure 15】
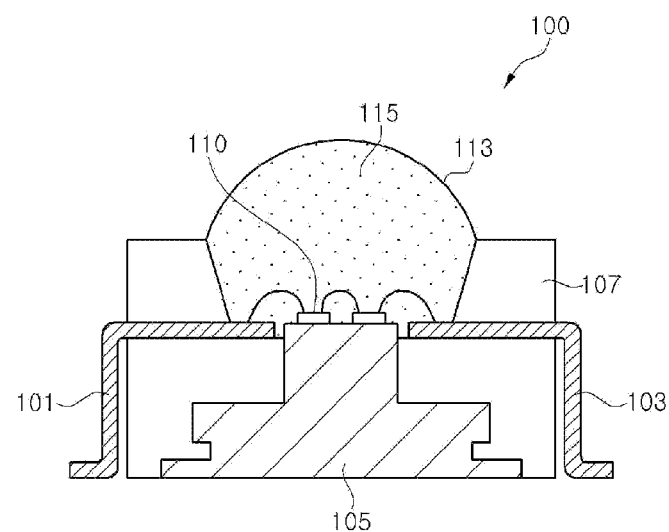

[Fig. 16]
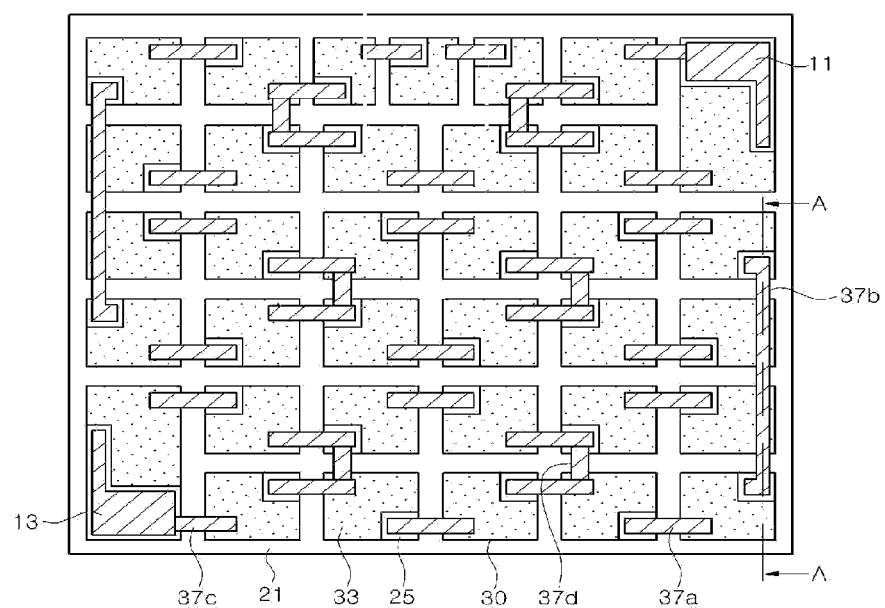

LIGHT EMITTING DIODE CHIP FOR HIGH VOLTAGE OPERATION AND LIGHT EMITTING DIODE PACKAGE INCLUDING THE SAME

CROSS REFERENCE TO RELATED APPLICATIONS

This application is the National Stage of International Application No. PCT/KR2010/000892, filed Feb. 12, 2010, and claims priority from and the benefit of Korean Patent Application No. 10-2009-0011325, filed on Feb. 12, 2009, which are both hereby incorporated by reference for all purposes as if fully set forth herein.

BACKGROUND OF THE INVENTION

Field of the Invention

The present disclosure relates to a light emitting diode chip and a light emitting diode package including the same and, more particularly, to a light emitting diode chip for high voltage operation and a light emitting diode package including the same.

Discussion of the Background

Compound semiconductor light emitting diodes (also referred to as "LEDs"), for example, III-V based LEDs, are widely used for display devices. Particularly, with merits of lower power consumption and longer lifespan than existing electric bulbs or fluorescent lamps, GaN LEDs are applicable not only to backlight sources but also to general lighting by replacing the existing incandescent lamps and fluorescent lamps.

An LED is repeatedly turned on/off depending on the direction of a current by an AC power source. Thus, when the LED is directly connected to the AC power source, there is a problem in that the LED does not continuously emit light and is liable to be damaged by the reverse current. Moreover, the LED has a low driving voltage of 3~4 V and thus cannot be directly connected to any high voltage power source like general power sources for domestic use, such as 110 V or 220 V.

In order to solve such problems of the LED, an LED that can be used by being directly connected to a high voltage AC power source is disclosed in International Publication No. WO 2004/023568 (A1), entitled "Light-emitting device having light-emitting elements" by Sakai et. al., and various other LEDs for the AC power source have been developed.

According to the PCT International Publication No. WO 2004/023568 (corresponding to U.S. Patent Application Publication No. 2005/0253151), LED elements are two-dimensionally arranged on an insulating substrate, for example, a sapphire substrate, and are connected in series to form an LED array. Two such LED arrays are connected in reverse parallel to each other on the sapphire substrate, thereby providing a single light emitting device that can be operated to continuously emit light using a high voltage AC power supply.

According to the PCT International Publication No. WO 2004/023568, one of the two arrays is operated during a half-period of the AC power source and the other array is operated during the subsequent half-period. In other words, half light emitting cells, that is, half LED elements, in the light emitting diode are operated during phase variation of the AC power source. Thus, utilization efficiency of the light emitting cells does not exceed 50%.

Meanwhile, it is known in the art that a light emitting diode consisting of a single light emitting cell has a longer lifespan than others. However, the LED array is formed by connecting a plurality of light emitting cells in series via wires, so that the lifespan of the light emitting diode depends not only on lifespan of each of the light emitting cells but also on characteristics of the wires and ohmic contacts. In other words, failure of any one of the light emitting cells in the LED array, breakage or short-circuit in any one of the wires, or failure in any one of the ohmic contacts entails failure of the light emitting diode. Moreover, the driving voltage of the LED array is obtained as the sum of a voltage drop in the light emitting cells and a voltage drop caused by resistance of the wires connecting the light emitting cells, ohmic contact resistance, and the like. Accordingly, the driving voltage of the LED array including the light emitting cells exhibits greater deviation than that of the light emitting diode consisting of a single light emitting cell. Such a deviation of the driving voltage can affect reliability, lifespan and the like of the light emitting diode including the LED arrays.

In order to evaluate reliability of an LED, various properties of the LED, such as optical and electric properties, are measured. Particularly, leakage current caused by application of a reverse voltage to the LED is a major item for reliability evaluation of the LED. For an LED including LED arrays connected in reverse parallel to each other, however, there is a problem that the leakage current is not measured upon application of the reverse voltage to one LED array. Therefore, there is a need for a new method for selective separation of reliable LEDs.

SUMMARY OF THE INVENTION

The present disclosure is directed to providing an LED chip for high voltage operation that can guarantee long lifespan, and an LED package including the same.

The present disclosure is also directed to providing an LED chip for high voltage operation that can improve utilization efficiency of light emitting cells operated on a single substrate, and an LED package including the same.

The present disclosure is further directed to providing a method for selective separation of LED chips for high voltage operation that can guarantee long lifespan.

In accordance with an aspect of the present disclosure, an LED chip comprises: a substrate; a first array formed on the substrate and including n light emitting cells connected in series; and a second array formed on the substrate and including m(m≤n) light emitting cells connected in series. During operation of the LED chip, the first array and the second array are operated by being connected in reverse parallel to each other. Further, when a driving voltage of the first array is defined as Vd1 and a driving voltage of the second array is defined as Vd2, a difference between Vd1 and Vd2×(n/m) is not more than 2V or $\frac{2}{3}\times(Vd1+Vd2)/(n+m)$.

The first array and the second array may include the same number of light emitting cells. In this case, the difference between Vd1 and Vd2 is not more than 2V or $\frac{2}{3}\times(Vd1+Vd2)/(2n)$.

When the difference between Vd1 and Vd2 is not more than 2V or $\frac{2}{3}\times(Vd1+Vd2)/(2n)$, the LED chip maintains 80% or more of initial luminous intensity even after operation for 1000 hours. Accordingly, after forming a plurality of light emitting cells to form the first and second arrays on a single wafer, individual driving voltages of the arrays in each chip are measured and the chips can be selectively identified as good chips when satisfying the requirement for the difference in driving voltage between the first and second arrays.

The LED chip for high voltage operation may further include: an anode and a is cathode of each of the light emitting cells in the first and second arrays; a first insulation layer covering the light emitting cells and having openings exposing the anode and the cathode of each of the light emitting cells; and wires formed on the first insulation layer and electrically connecting the light emitting cells to one another through the openings in the first insulation layer. Further, at least one of the wires may electrically connect four light emitting cells to one another such that cathodes of two light emitting cells are electrically connected to anodes of the other two light emitting cells by the at least one wire.

The wires are formed by a step cover process and are supported by a layer (for example, the first insulation layer) under the wires. Accordingly, the wires have improved process stability and reliability as compared with air-bridge wires or bonding-wires.

The anode and the cathode are opposite terminals through which a current flows into or from the corresponding light emitting cell, and may be made of any material that can be connected to the wires. For example, the cathode may be a first conductive-type semiconductor layer or an electrode pad formed on the first conductive-type semiconductor layer, and the anode may be a second conductive-type semiconductor layer, a transparent electrode layer formed on the second conductive-type semiconductor layer, or an electrode pad formed on the second conductive-type semiconductor layer or the transparent electrode layer.

The two light emitting cells may be disposed between the other two light emitting cells. In general, the cathodes are located below the anodes. In this embodiment, the cathodes are disposed between the anodes, thereby enhancing stability of the wiring process for electrically connecting the four light emitting cells. Furthermore, the first conductive-type semiconductor layers of the two light emitting cells may be separated from each other, but may also be connected to each other. When the first conductive-type semiconductor layers of the two light emitting cells are connected to each other, wire connection between the two light emitting cells may be facilitated and the wires therebetween may be prevented from being broken due to a step formed between these light emitting cells. Here, the connection between the first conductive-type semiconductor layers means that the first conductive-type semiconductor layers are connected to each other without being physically disconnected from each other.

The light emitting diode chip may further include a second insulation layer covering the wires. The second insulation layer protects the wires and the light emitting cells from external force or moisture. The first insulation layer may be thicker than the second insulation layer. A greater thickness of the first insulation layer may prevent short circuit of the light emitting cells and wires and insulation failure of the first insulation layer.

The second insulation layer may contain a phosphor. As a result, it is possible to provide a light emitting diode chip that contains the phosphor at a chip level.

Each of the first and second arrays may include full-wave light emitting cells and is half-wave light emitting cells while sharing the full-wave light emitting cells. Here, the wires may include a wire(s) that electrically connects an anode of one full-wave light emitting cell to cathodes of two half-wave light emitting cells. Further, the wires may include a wire(s) that electrically connects a cathode of one full-wave light emitting cell to anodes of two half-wave light emitting cells.

Herein, the term "half-wave light emitting cell" refers to a light emitting cell to which forward voltage is applied during a half-period of an AC power source and reverse voltage is applied during the next half-period of the AC power source. The term "full-wave light emitting cell" refers to a light emitting cell to which the forward voltage is applied regardless of phase variation of the AC power source. The use of the full-wave light emitting cell may lead to an improvement in utilization efficiency of the light emitting cells in the LED.

In accordance with another aspect, an LED package includes the LED chip for high voltage operation. The LED package may further include a phosphor converting a wavelength of light emitted from the LED chip. The phosphor may be contained in a second insulation layer of the LED chip, thereby providing a light emitting diode chip that contains the phosphor at a chip level. Alternatively, the phosphor may be disposed on top of the LED chip after the LED chip is mounted in the LED package.

In accordance with a further aspect of the present disclosure, an LED package is includes at least two LED chips connected in series to each other. Further, each of the at least two LED chips may include: a substrate; a first array formed on the substrate and including n light emitting cells connected in series; and a second array formed on the substrate and including m($m \leq n$) light emitting cells connected in series. The first arrays of the at least two LED chips are connected in series to each other, the second arrays of the at least two LED chips are connected in series to each other, and during operation of the LED chips, the first arrays and the second arrays are operated by being connected in reverse parallel to each other. Further, when the driving voltage of the first arrays is defined as Vd1 and the driving voltage of the second arrays is defined as Vd2, a difference between Vd1 and Vd2×(n/m) is not more than 2V or $\frac{2}{3} \times (Vd1+Vd2)/(n+m)$.

The LED package may further include a phosphor that converts a wavelength of light emitted from the LED chips.

Herein, the term "driving voltage (Vd)" of each of the arrays refers to voltage that is applied to opposite ends of the corresponding array when a driving current of, e.g., 20 mA flows in the corresponding array. The driving voltage may be obtained by measuring the voltage between pads at opposite ends of the corresponding array. Alternatively, the driving voltage of each of the arrays may be obtained in a package state by measuring the voltage between leads of a package. Since the voltage drop occurring in each of the arrays due to the serial connection is between the plurality of light emitting cells is greater than the voltage drop caused by the leads and the wires connecting the leads to the LED, the voltage between the leads and the voltage between the pads at the opposite ends of each array will exhibit substantially the same value. Accordingly, it can be regarded that the voltage applied between the leads of the package in the package state represents the voltage applied between the pads at the opposite ends of each of the arrays.

Embodiments of the present invention provide an LED chip for high voltage operation and an LED package including the same that are capable of maintaining 80% or more of initial luminous intensity even after operation for 1000 hours. Further, the LED chip includes full-wave light emitting cells, thereby improving utilization efficiency of the light emitting cells on a single substrate. Further, the LED chip has a combination of the full-wave light emitting cells and half-wave light emitting cells, thereby preventing an increase in reverse voltage applied to each of the half-wave light emitting cells. Furthermore, according to one embodiment, there is to provided a method of selectively separating LED chips capable of guaranteeing long lifespan from other LED chips.

BRIEF DESCRIPTION OF THE DRAWINGS

FIG. 1 is a schematic plan view of an LED chip according to one embodiment of the present disclosure;

FIG. 2 is a cross-sectional view taken along line A-A of FIG. 1;

FIG. 3 is an equivalent circuit diagram of the LED chip of FIG. 1;

FIG. 4 is a graph depicting variation in luminous intensity of LED chips depending on time for various differences in driving voltage between a first array and a second array of each LED chip;

FIG. 5 is a schematic plan view of an LED chip according to another embodiment of the present disclosure;

FIG. 6 is a cross-sectional view taken along line A-A of FIG. 5;

FIG. 7 is a cross-sectional view of an LED chip according to a further embodiment of the present disclosure;

FIG. 8 is a plan view of an LED chip according to yet another embodiment of the present disclosure;

FIG. 9 is a plan view of an LED chip according to yet another embodiment of the present disclosure;

FIG. 10 is a plan view of an LED chip according to yet another embodiment of the present disclosure;

FIG. 11 is a plan view of an LED chip according to yet another embodiment of is the present disclosure;

FIG. 12 is an equivalent circuit diagram of the LED chip of FIG. 11;

FIG. 13 is a plan view of an LED chip according to yet another embodiment of the present disclosure;

FIG. 14 is a plan view of an LED chip according to yet another embodiment of the present disclosure;

FIG. 15 is a cross-sectional view of an LED package according to one embodiment of the present disclosure; and FIG. 16 is a schematic plan view of an LED chip according to yet another embodiment of the present disclosure.

DETAILED DESCRIPTION OF THE ILLUSTRATED EMBODIMENTS

Exemplary embodiments of the present disclosure will now be described in detail with reference to the accompanying drawings. The following embodiments are given by way of illustration to provide a thorough understanding of the invention to those skilled in the art. Hence, it should be understood that other embodiments will be evident based on the present disclosure, and that system, process or mechanical changes may be made without departing from the scope of the present disclosure. Likewise, it should be noted that the drawings are not to precise scale and some of the dimensions, such as width, length, thickness, and the like, are exaggerated for clarity of description in the drawings. Like elements are denoted by like reference numerals throughout the specification and drawings.

FIG. 1 is a schematic plan view of an LED chip according to one embodiment, FIG. 2 is a cross-sectional view taken along line A-A of FIG. 1, and FIG. 3 is an equivalent circuit diagram of the LED chip of FIG. 1.

Referring to FIG. 1, an LED chip of this embodiment includes a substrate 21, a plurality of light emitting cells 30, wires 37a, 37b, 37c, 37d, and bonding pads 11, 13. The light emitting cells 30 are formed on the substrate 21, connected in series to each other via the wires 37a, 37b to form arrays, and connected to the bonding pads 11, 13. The arrays 10, 15 (see FIG. 3) of the light emitting cells 30 are connected in reverse parallel between the bonding pads 11, 13 to be operated by an AC power source.

The substrate 21 may be formed of any material that can electrically insulate the light emitting cells 30 from each other thereon. The substrate may be a substrate for growth of compound semiconductors, for example, nitride semiconductors, and may be, but is not limited to, a sapphire substrate. Alternatively, the substrate may be a bonding substrate bonded to a nitride semiconductor grown on the substrate.

Each of the wires 37a connects two light emitting cells 30 in series by electrically connecting an anode of one light emitting cell 30 to a cathode of the other light emitting cell 30. The wire 37b electrically connects four light emitting cells 30 in sequence. The wires 37c electrically connect the bonding pads 11, 13 to the light emitting cells 30. As shown in the drawings, the bonding pads 11, 13 may be formed on the light emitting cells 30 or may be formed on the substrate 21 to be separated from the light emitting cells 30.

The wire 37b is electrically connected at opposite ends thereof to cathodes of two light emitting cells, respectively, and is also connected to anodes of two other light emitting cells between the two light emitting cells. Alternatively, the wire 37b may be electrically connected at the opposite end thereof to anodes of the two light emitting cells, respectively, and may also be connected to cathodes of the other two light emitting cells between the two light emitting cells.

The wire 37d electrically connects the light emitting cells to each other between the arrays connected in reverse parallel. Each of the wires 37d serves to allow the light emitting cells between the arrays to have the same potential. The wires 37d may prevent a high reverse voltage from being applied to a certain light emitting cell in the array to which the reverse voltage is applied.

The light emitting cells 30 may be formed to have the same area or to have different areas. Each of the light emitting cells 30 includes a first conductive-type semiconductor layer, an active layer, and a second conductive-type semiconductor layer. If the first conductive-type semiconductor layer is an n-type semiconductor layer, the second conductive-type semiconductor layer is a p-type semiconductor layer, on which a transparent electrode layer 33 may be disposed.

FIG. 16 is a schematic plan view of an LED chip according to yet another embodiment of the present disclosure. The LED chip of FIG. 16 is substantially similar to the LED chip described above with respect to FIG. 1, except that the first array includes more light emitting cells n than light emitting cells m in the second array.

Referring to FIG. 2, there are four light emitting cells 30 on the substrate 21. The light emitting cells 30 are separated from each other. Each of the light emitting cells includes a first semiconductor layer 25, an active layer 27, and a second conductive-type semiconductor layer 29. The active layer 27 may have a single-quantum well structure or a multi-quantum well structure, and the material and composition of the active layer 27 may be selected depending on a desired wavelength of light. For example, the active layer may be formed of an AlInGaN-based compound semiconductor, such as InGaN. On the other hand, the first and second conductive-type semiconductor layers 25, 29 are composed of AlInGaN-based compound semiconductors, such as GaN, which have a greater band-gap than the active layer 27.

A buffer layer (not shown) may be interposed between the first conductive-type semiconductor layer 25 and the substrate 21. The buffer layer serves to relieve the lattice mismatch between the substrate 21 and the first conductive-type semiconductor layer 25 during growth of the first conductive-type semiconductor layer 25 on the substrate 21.

The second conductive-type semiconductor layer 29 is located above some region of the first conductive-type semiconductor layer 25, with the active layer 27 interposed between the first conductive-type semiconductor layer 25 and the second conductive-type semiconductor layer 29. Further, the transparent electrode layer 33 may be located on the second conductive-type semiconductor layer 29. The transparent electrode layer 33 may be formed of a material such as indium tin oxide (ITO), Ni/Au, or the like.

The wire 37b is formed along an edge of the substrate 21 to electrically connect the four light emitting cells 30 to one another. The wire 37b sequentially connects the four light emitting cells 30 to one another across upper sides thereof by being electrically connected to the cathodes of the two light emitting cells, for example, the first conductive-type semiconductor layers 25, and to the anodes of the other two light emitting cells, for example, the second conductive-type semiconductors 29 or the transparent electrode layers 33. As shown in the drawing, the wire 37b may be electrically connected at the opposite ends thereof to the cathodes of the two light emitting cells, respectively, and may also be electrically connected to the anodes of the other two light emitting cells between the two light emitting cells.

The wires 37a, 37b, 37c, 37d are formed on the first insulation layer 35 and are insulated from sidewalls of the light emitting cells 30. The wires are formed by a step-cover process and are distinguished from air-bridge wires or bonding wires on the light emitting cells 30. The first insulation layer 35 is formed of silicon oxide or silicon nitride. The wires may be covered with the second insulation layer 39. The second insulation layer 39 protects the wires and the light emitting cells from external force or moisture by covering the wires and the light emitting cells. The second insulation layer 39 may be formed of silicon oxide or silicon nitride, and may be formed of the same material as that of the first insulation layer 35 to increase bonding force. On the other hand, if the first insulation layer 35 has a small thickness, there is likelihood of electrical short circuit between the wires and the light emitting cells, particularly, insulation failure during operation using a high voltage AC power source. Accordingly, the first insulation layer 35 preferably has a greater thickness than the second insulation layer 39.

Further, the second insulation layer 39 may contain a phosphor for converting the wavelength of light emitted from the light emitting cells 30. By providing the phosphor to the second insulation layer 39, it is possible to provide a uniform wavelength conversion layer and to simplify a process of fabricating a package.

The wire 37b allows the light emitting cells to be arranged in a matrix on the single substrate 21 or to be arranged thereon such that the light emitting cells alternately emit light in a row unit.

Referring to FIG. 3, a first array 10 and a second array 15, in each of which the light emitting cells 30 are connected in series, are located between the bonding pads 11, 13. These arrays 10, 15 are connected in reverse parallel between the bonding pads 11, 13 and are alternately operated by an AC power source. In this embodiment, the first and second arrays 10, 15 are illustrated as being connected in reverse parallel between the bonding pads 11, 13, but they may be connected to bonding pads separated from each other. In other words, the second array may be provided at opposite ends thereof with the bonding pads that are independent of the bonding pads provided to opposite ends of the first array.

When a driving current of, e.g. 20 mA, flows in the first array 10 by application of forward voltage to the first array 10, the driving voltage of the first array 10 is Vd1, and when a driving current of, e.g. 20 mA, flows in the second array 15 by application of the forward voltage to the second array 15, the driving voltage of the second array 15 is Vd2.

In this embodiment, the number of light emitting cells in each of the first and second arrays 10, 15 is 17, and the driving voltage of the first and second arrays 10, 15 is about 50~60 V. When two LED chips each including the first and second arrays are connected in series to each other, they can be operated using a 110 V AC power source.

The number of light emitting cells in each of the first and second arrays may be the same, but is not limited thereto. Further, the number of light emitting cells in each of the first and second arrays may be variously changed. Further, the number of LED chips connected in series to each other may be changed depending on the voltage of the AC power source. Here, an increase in number of LED chips connected in series to one another complicates the chip connecting process and is thus undesirable. Thus, the number of light emitting cells in each of the first and second arrays is preferably 8 or more.

FIG. 4 is a graph depicting variation in luminous intensity of LED chips depending on time for various differences in driving voltage between a first array and a second array of each LED chip. Each LED chip includes first and second arrays disposed as shown in FIG. 1 and each having 17 light emitting cells.

Referring to FIG. 4, LED chips, each of which has a difference of 2 V or less between the driving voltage Vd1 of the first array 10 and the driving voltage Vd2 of the second array 15, maintain 80% or more of initial luminous intensity even after operation for 1000 hours. In this case, however, LED chips, each of which has a difference of 2.5 V or more between the driving voltages Vd1 and Vd2, undergo a significant reduction in luminous intensity to 40% or less of the initial luminous intensity. Accordingly, it can be seen that an LED chip having a difference of 2 V or less between the driving voltages of the first and second arrays can guarantee a lifespan of 1000 hours or more.

In this embodiment, the light emitting cells are composed of a GaN-based compound semiconductors, and each of the GaN-based light emitting cells has a driving voltage of about 3 V. Accordingly, it is considered that, when the difference in driving voltage between first and second arrays of a certain LED chip is about two-thirds or less of the driving voltage of a single light emitting cell, long lifespan can be guaranteed not only for the LED chip of the GaN-based compound semiconductors but also for LED chips of other compound semiconductors. On the other hand, although a known driving voltage according to the kind of compound semiconductor may be used, the driving voltage of the single light emitting cell may be approximately obtained by dividing the sum (n+m) of the driving voltages of the first and second arrays, (Vd1+Vd2), by the sum of the number (n) of light emitting cells in the first array and the number (m) of light emitting cells in the second array.

According to this embodiment, when the difference between the driving voltages of the first and second arrays in the LED chip is maintained to be not more than 2V or $\frac{2}{3} \times (Vd1+Vd2)/(n+m)$, the LED chip can maintain 80% or more of initial luminous intensity even after operation for 1000 hours.

Further, this result leads to a method of selectively separating LED chips capable of guaranteeing long lifespan among numerous LED chips formed on a single wafer. In other words, when LED chips, each having first and second arrays, are formed on a single wafer, driving voltages of the arrays in each of the LED chips are measured to select LED chips, in which the difference between the driving voltages of these arrays is not more than 2V or $\frac{2}{3} \times (Vd1+Vd2)/(n+m)$, so that LED chips capable of guaranteeing long lifespan can be selectively separated from others.

Next, LED chips according to various embodiments of the present disclosure will be schematically described.

FIG. 5 is a schematic plan view of an LED chip according to another embodiment of the present disclosure.

Referring to FIG. 5, an LED chip of this embodiment includes a substrate 21, a plurality of light emitting cells 30, wires 37a, 37b, 37c, and bonding pads 41, 43, as in the above embodiment described with reference to FIG. 1. The arrays of the light emitting cells 30 are connected in reverse parallel between bonding pads 41, 43 to be operated by an AC power source. In this embodiment, the wire 37d is not illustrated, but may be formed as in the embodiment of FIG. 1.

The bonding pads 41, 43 are connected to anodes and cathodes of at least two light emitting cells 30 through the wires 37c, respectively. The bonding pads 41, 43 may have the same or different shapes. The bonding pads 41, 43 may be formed on the substrate 21, as shown in FIG. 5, or may be formed on a first conductive-type semiconductor layer 25 or a second conductive-type semiconductor layer 29.

The wire 37b is electrically connected at opposite ends thereof to cathodes of two light emitting cells, respectively, and is also connected to anodes of two other light emitting cells between the two light emitting cells. In general, the cathodes are located below the anodes. In this embodiment, however, process stability in the formation of the wires 37b can be obtained by disposing the wires 37b as described above.

Further, the wire 37b is configured to connect four light emitting cells to one another, thereby achieving effective arrangement of the arrays of the light emitting cells connected in reverse parallel to each other on a single substrate having a limited area. Further, the four light emitting cells are connected through a single wire 37b, thereby simplifying the process as compared with the process of connecting the light emitting cells using wires, respectively.

FIG. 6 is a cross-sectional view taken along line A-A of FIG. 5.

Referring to FIG. 6, there are four light emitting cells 30 on the substrate 21. The light emitting cells 30 are separated from each other. Each of the light emitting cells includes a first semiconductor layer 25, an active layer 27, and a second conductive-type semiconductor layer 29, as in the embodiment described with reference to FIG. 2.

The wire 37b is formed along an edge of the substrate 21 to electrically connect the four light emitting cells 30 to one another. Across upper sides of the four light emitting cells 30, the wire 37b is electrically connected to the anodes of the two light emitting cells, for example, second conductive-type semiconductor layers 29 or transparent electrode layers 33 (e.g., anodes), and to the cathodes of the other two light emitting cells, for example, first conductive-type semiconductor layers 25 (e.g., cathodes), thereby sequentially connecting the four light emitting cells 30 to one another. That is, the wire 37b is electrically connected at the opposite ends thereof to the anodes of the two light emitting cells 30, respectively, and is also connected to the cathodes of the other two light emitting cells 30a, 30b between the two light emitting cells.

As in the embodiment described with reference to FIG. 2, the wires 37a, 37b, 37c are formed on the first insulation layer 35 and insulated from the sidewalls of the light emitting cells 30. The wires may be covered with the second insulation layer 39. Further, the first insulation layer 35 may have a plurality of openings $OP_1$, $OP_2$ formed therethrough so that each opening exposes the anode or the cathode of the light emitting cell.

FIG. 7 is a cross-sectional view of an LED chip according to a further embodiment of the present disclosure.

Referring to FIG. 7, the LED chip of this embodiment is similar to the LED chip described with reference to FIG. 6. In this embodiment, however, the first conductive-type semiconductor layers 25 of the other light emitting cells connected to the wire 37b are connected to each other. In other words, the first conductive-type semiconductor layers 25 of the other two light emitting cells 30a, 30b (see FIG. 5) are connected to each other, instead of being separated from each other. On other hand, the second conductive-type semiconductor layers 29 on the first conductive-type semiconductor layers 25 are separated from each other.

As the first conductive-type semiconductor layers 25 of the other two light emitting cells 30a, 30b are connected to each other, a division area between the light emitting cells 30a, 30b is eliminated, thereby reducing a stepped area on the substrate 21. As a result, the formation of the wires 37b can be facilitated, while enhancing reliability of the wires.

FIG. 8 is a plan view of an LED chip according to yet another embodiment of the present disclosure.

Referring to FIG. 8, an LED chip of this embodiment is similar to the LED chip described with reference to FIG. 5. In this embodiment, however, the light emitting cells are arranged in six rows. In this case, the bonding pads 41, 43 may be diagonally disposed, and a wire 57b may be formed to connect four other light emitting cells to one another in addition to the wire 37b that connects the four light emitting cells to one another.

Like the wire 37b described with reference to FIG. 5, the wire 57b is electrically connected to anodes of two light emitting cells and cathodes of two other light emitting cells 50a, 50b across the upper sides thereof, thereby electrically connecting the four light emitting cells 30 to one another in sequence. That is, the wire 57b is electrically connected at opposite ends thereof to anodes of two light emitting cells 30, respectively, and is also connected to cathodes of two other light emitting cells 50a, 50b. In this case, first conductive-type semiconductors of the light emitting cells 50a, 50b may be connected to each other.

The wires 37b, 57b are diagonally disposed along opposite edges of the substrate, respectively. Accordingly, the light emitting cells may be arranged in a matrix shape to alternately emit light in a row unit.

FIG. 9 is a plan view of an LED chip according to yet another embodiment of the present disclosure.

Referring to FIG. 9, an LED chip of this embodiment is similar to the LED chip described with reference to FIG. 8. In this embodiment, however, bonding pads 51, 53 have different shapes from the bonding pads 41, 43. Specifically, the bonding pads 51, 53 have a rectangular shape, whereas each of the bonding pads 41, 43 includes a wide portion and a portion extending therefrom. It should be noted that the shapes of the bonding pads 51, 53 are not limited thereto and may be changed depending on the size and arrangement of the light emitting cells. Particularly, the bonding pads 51, 53 may be located within an area where the light emitting cells 30 are arranged.

FIG. 10 is a plan view of an LED chip according to yet another embodiment of the present disclosure.

Referring to FIG. 10, an LED chip of this embodiment is similar to the LED chip described with reference to FIG. 8. In this embodiment, however, bonding pads 61, 63 are formed on light emitting cells 30. In other words, the bonding pads 61, 63 are respectively formed on anodes and cathodes of two light emitting cells 30 and electrically connected thereto. Accordingly, the wires 37c for connecting the bonding pads to the light emitting cells are eliminated in this embodiment.

FIG. 11 is a plan view of an LED chip according to yet another embodiment of the present disclosure, and FIG. 12 is an equivalent circuit diagram of the LED chip of FIG. 11.

Referring to FIGS. 11 and 12, an LED chip of this embodiment includes a substrate 21, bonding pads 71, 73, a plurality of half-wave light emitting cells 30, a plurality of full-wave light emitting cells 70, and wires 37b, 37c, 77b, 77e, 77d. Here, the term "half-wave light emitting cell" refers to a light emitting cell to which forward voltage is applied during a half-period of an AC power source, and the term "full-wave light emitting cell" refers to a light emitting cell to which the forward voltage is applied during a full period of an AC power source.

The substrate 21 and the half-wave light emitting cells 30 are similar to those described with reference to FIGS. 1 and 2. In this embodiment, however, the half-wave light emitting cells 30 are disposed to face each other in a single row. In other words, the half-wave light emitting cells 30c, 30d are disposed such that an anode or cathode of one half-wave light emitting cell faces a cathode or anode of another half-wave light emitting cell.

The full-wave light emitting cells 70 are disposed between rows of the half-wave light emitting cells 30 such that a cathode of each of the full-wave light emitting cells 70 is electrically connected to anodes of two half-wave light emitting cells 30 through the wire 77d and an anode of each of the full-wave light emitting cells 70 is electrically connected to cathodes of two half-wave light emitting cells 30 through the wire 77e. Further, a certain half-wave light emitting cell 70 is disposed in a forward direction between an anode of one full-wave light emitting cell 70 and a cathode of another full-wave light emitting cell 70 adjacent thereto, and another half-wave light emitting cell 70 is disposed in the forward direction between a cathode of the one full-wave light emitting cell 70 and an anode of the full-wave light emitting cell 70 adjacent thereto.

The full-wave light emitting cells 70 are shared by the arrays connected in reverse parallel between the bonding pads 71, 73. Accordingly, there is provided an AC LED chip, in which the half-wave light emitting cells 30 are alternately operated, and the full-wave light emitting cells 70 are operated for the overall period, when an AC power source is connected to the bonding pads 71, 73. Thus, it is possible to improve utilization efficiency of the light emitting cells operated on the single substrate 21. Moreover, the reverse voltage applied to the half-wave light emitting cells 30 for a half period can be adjusted to a relatively low value by a suitable combination of the full-wave light emitting cells and the half-wave light emitting cells. In FIG. 8, the maximum reverse voltage applied to the half-wave light emitting cells 30 is the same as the forward voltage applied to two full-wave light emitting cells 70 and one half-wave light emitting cell 30.

In FIGS. 11 and 12, the LED chip is illustrated as including a single full-wave light emitting cell 70 disposed between rows of the half-wave light emitting cells, but it should be understood that the LED chip may include a plurality of full-wave light emitting cells 70 disposed in an array between the rows of the half-wave light emitting cells. Further, the LED chip may include a plurality of half-wave light emitting cells disposed in an array between adjacent full-wave light emitting cells 70. In this case, however, the number of full-wave or half-wave light emitting cells disposed in an array is restricted in consideration of the reverse voltage applied to the half-wave light emitting cells.

On the other hand, since the light emitting cells 30 are disposed to face each other, the wires 77d, 77e may electrically connect one full-wave light emitting cell 70 to two half-wave light emitting cells 30 without being bifurcated, thereby enhancing stability in the wiring process.

As described with reference to FIGS. 5 and 6, the wire 37b electrically connects four light emitting cells to one another. Further, the wire 77b is disposed diagonal to the wire 37b and electrically connects four light emitting cells to one another. The wire 77b is electrically connected at opposite ends thereof to cathodes of two half-wave light emitting cells, and is also connected to anodes of two other half-wave light emitting cells 70a, 70b between the two half-wave light emitting cells. Alternatively, as in the wire 37b, the wire 77b may be electrically connected at the opposite ends thereof to anodes of the two half-wave light emitting cells, and may also be connected to cathodes of the other two light emitting cells 70a, 70b between these light emitting cells. By adjusting the number of half-wave light emitting cells arranged in one row, the wire 37b and the wire 77b connect the half-wave light emitting cells to one another in the same sequence or in different sequences.

Although the bonding pads 71, 73 are illustrated as being located between the uppermost row and the lowermost row of the half-wave light emitting cells in this embodiment, it should be understood that they may have various shapes and be located at different places without being limited thereto. Further, the bonding pads 71, 73 may be formed on two half-wave light emitting cells 30, so that the wires 37c are eliminated.

FIG. 13 is a plan view of an LED chip according to yet another embodiment of the present disclosure. The equivalent circuit diagram of the LED chip of this embodiment is the same as that shown in FIG. 12.

Referring to FIG. 13, the LED chip of this embodiment is similar to the LED chip described with reference to FIG. 11. In this embodiment, however, first conductive-type semiconductor layers 25 of light emitting cells 30c, 30d having cathodes disposed to face each other are connected to each other. First conductive-type semiconductor layers 25 of half-wave light emitting cells 30a, 30b connected to a wire 37b may also be connected to each other.

Accordingly, steps formed to separate the light emitting cells 30 can be reduced, thereby facilitating the formation of the wires 37b, 77d, 77e while enhancing reliability thereof.

FIG. 14 is a plan view of an LED chip according to yet another embodiment of the present disclosure. The equivalent circuit diagram of the LED chip of this embodiment is the same as that shown in FIG. 12.

Referring to FIG. 14, an LED chip of this embodiment includes a substrate 21, bonding pads 91, 93, a plurality of half-wave light emitting cells 30, a plurality of full-wave light emitting cells 80, and wires 37b, 77b, 87e, 87d.

The substrate 21 and the half-wave light emitting cells 30 are similar to those described with reference to FIGS. 1 and 2. In this embodiment, however, the light emitting cells 30 are disposed to face each other in a single row. In other words, each of light emitting cells 30c, 30d is disposed such that an anode or cathode of one light emitting cell faces a cathode or anode of another light emitting cell.

The full-wave light emitting cells 80 are disposed across two rows of the half-wave light emitting cells 30 to be located between the half-wave light emitting cells 30 facing each other. A cathode of each of the full-wave light emitting cells 80 is electrically connected to anodes of two half-wave light emitting cells 30 through the wire 87d, and an anode of each of the full-wave light emitting cells 80 is electrically connected to cathodes of the two half-wave light emitting cells 30 through the wire 87e. Each of the wires 87d, 87e passes over one full-wave light emitting cell 80 and sequentially connects it to two half-wave light emitting cells 30. Further, a certain half-wave light emitting cell 30 is disposed in a forward direction between an anode of one full-wave light emitting cell 80 and a cathode of another full-wave light emitting cell 80 adjacent thereto, and another half-wave light emitting cell 30 is disposed in the forward direction between a cathode of the one full-wave light emitting cell 80 and an anode of the full-wave light emitting cell 80 adjacent thereto.

Thus, the LED chip has the equivalent circuit diagram as shown in FIG. 12.

In this embodiment, the LED chip is illustrated as including a single full-wave light emitting cell 80 disposed between the half-wave light emitting cells, but it should be understood that the LED chip may include a plurality of full-wave light emitting cells 80 disposed in an array between the half-wave light emitting cells. Further, the LED chip may include a plurality of half-wave light emitting cells disposed in an array between adjacent full-wave light emitting cells 70. In this case, however, the number of full-wave or half-wave light emitting cells disposed in an array is restricted in consideration of the reverse voltage applied to the half-wave light emitting cells.

On the other hand, each of the wire 37b and the wire 77b electrically connects four light emitting cells to one another as described with reference to FIG. 11.

In this embodiment, the bonding pads 91, 93 are formed on the two half-wave light emitting cells 30 to be electrically connected thereto, so that the wires 37c (see FIG. 7) are eliminated.

The light emitting diode chips of the embodiments have been illustrated above. Each of the LED chips includes the first array including n light emitting cells connected in series and the second array including m light emitting cells connected in series, in which the first and second arrays may be operated by being connected in reverse parallel to each other during operation of the LED chip. As described above, the first and second arrays may be connected in reverse parallel to the bonding pads formed on the substrate 21 or on the light emitting cells, but are not limited thereto. In other words, the first and second arrays may be electrically separated from each other at a chip level, and may be connected in reverse parallel via bonding wires in a package state.

On the other hand, the LED chip may be mounted in a variety of packages. Further, a plurality of LED chips may be mounted in the same package. Furthermore, a phosphor may be used to convert the wavelength of light emitted from the LED chip.

FIG. 15 is a cross-sectional view of an LED package according to one embodiment of the present disclosure.

Referring to FIG. 15, an LED package 100 includes leads 101, 103, a package body 107 and LED chips 110, and may further include a heat sink 105, a molding member 113 and a phosphor 115.

The leads 101, 103 serve to electrically connect the LED chips to an external circuit or a power source and may be bent to have various shapes. On the other hand, the heat sink 105 serves to dissipate and discharge heat from the LED chips to the outside. The package body 107 supports the leads 101, 103 and the heat sink 105 while defining an area for mounting the LED chips.

The LED chips 110 are mounted on the heat sink 105. Each of the LED chips 110 is the LED chip for high voltage operation described above and includes the first and second arrays of light emitting cells. These first and second arrays are connected in reverse parallel to an external AC power source to be alternately operated by the AC power source. As shown in FIG. 15, two LED chips 110 may be connected in series to each other. Accordingly, the first arrays of the LED chips 110 are connected in series to each other, and the second arrays thereof are connected in series to each other.

The LED chips 110 may be connected via bonding wires, and each of the LED chips 110 may be electrically connected to the leads via the bonding wires. Accordingly, the arrays of the light emitting cells are connected in reverse parallel between the leads 101, 103.

Here, assuming the driving voltage of the first arrays is Vd1, the number of light emitting cells in each of the first arrays is "n", the driving voltage of the second arrays is Vd2, and the number of light emitting cells in each of the second arrays is "m", the difference between Vd1 and Vd2×n/m is not more than 2V or $\frac{2}{3} \times (Vd1+Vd2)/(n+m)$. Accordingly, the LED package may be guaranteed a long lifespan.

On the other hand, the molding member 113 covers the LED chips 110 to protect the same from the external environment. Further, the molding member 113 has a lens shape to control an orientation angle of light emitted from the LED chips 110.

The phosphor 115 serves to convert the wavelength of light emitted from the LED chips 110. The phosphor 115 may be dispersed in the molding member 113, but is not limited thereto. For example, the phosphor may be provided above the LED chips 110 or the molding member 115.

In this embodiment, the LED package is illustrated as including two LED chips connected in series to each other. However, it should be understood that the LED package may include a single LED chip or three or more LED chips connected in series. Further, the LED package is illustrated as including the heat sink in this embodiment, but it should be understood that various packages well known in the art may also be used.

The various embodiments described above can be combined to provide further embodiments. All of the patents, patent application publications, patent applications, foreign patents, foreign patent applications and non-patent publications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. Therefore, it should be understood that the above embodiments are provided not for the purpose of limitation but for illustration only. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode (LED) chip for high voltage operation from an alternating current (AC) power source, comprising:
   a substrate;
   a first array of light emitting cells arranged on the substrate, the first array comprising n light emitting cells connected in series; and
   a second array of light emitting cells arranged on the substrate, the second array comprising m light emitting cells connected in series,
   wherein the first array and the second array are connected in reverse parallel to each other,
   wherein a magnitude of a driving voltage of the first array is defined as Vd1, a magnitude of a driving voltage of the second array is defined as Vd2, and a difference between Vd1 and Vd2×(n/m) is more than 0 and less than or equal to $\frac{2}{3} \times (Vd1+Vd2)/(n+m)$, and
   wherein n and m are natural numbers, and
   wherein the magnitude of the driving voltage of each array is at least about 50V and refers to a magnitude of voltage applied to opposite ends of the corresponding array when a predetermined amount of driving current flows in the corresponding array.

2. The LED chip according to claim 1, wherein each light emitting cell in the first array and the second array comprises:
   an anode and a cathode;
   a first insulation layer covering the light emitting cells, the first insulation layer comprising a plurality of openings, each opening exposing at least one of the anode and the cathode of a light emitting cell; and
   wires arranged on the first insulation layer, the wires electrically connecting the light emitting cells to one another through the openings,
   wherein a first wire of the wires electrically connects four light emitting cells to one another such that cathodes of two light emitting cells are electrically connected to anodes of the other two light emitting cells by the first wire.

3. The LED chip according to claim 2, wherein the two light emitting cells are arranged between the other two light emitting cells.

4. The LED chip according to claim 2, wherein each of the first array and the second array comprises full-wave light emitting cells and half-wave light emitting cells, the full-wave light emitting cells being shared by the first array and the second array, and
   wherein the wires comprise a wire electrically connecting an anode of one full-wave light emitting cell to cathodes of two half-wave light emitting cells.

5. The LED chip according to claim 2, further comprising: a second insulation layer covering the first insulation layer and the wires, the second insulation layer comprising a phosphor.

6. An LED package comprising:
   the LED chip according to claim 1; and
   a phosphor to convert a wavelength of light emitted from the LED chip.

7. The LED package according to claim 6, wherein each light emitting cell in the first array and the second array of the LED chip comprises:
   an anode and a cathode;
   a first insulation layer covering the light emitting cells, the first insulation layer comprising a plurality of openings, each opening exposing at least one of the anode and the cathode of a light emitting cell;
   wires arranged on the first insulation layer, the wires electrically connecting the light emitting cells to one another through the openings; and
   a second insulation layer covering the first insulation layer and the wires,
   wherein a first wire of the wires electrically connects four light emitting cells to one another such that cathodes of two light emitting cells are electrically connected to anodes of the other two light emitting cells by the first wire, and
   wherein the second insulation layer comprises a phosphor.

8. A light emitting diode (LED) package for high voltage operation from an alternating current (AC) power source, comprising:
   a first LED chip and a second LED chip connected in series, each LED chip comprising:
   a substrate;
   a first array arranged on the substrate and comprising n light emitting cells connected in series; and
   a second array arranged on the substrate and comprising m light emitting cells connected in series;
   wherein the first arrays of the first LED chip and the second LED chip are connected in series to each other, and the second arrays of the first LED chip and the second LED chip are connected in series to each other,
   wherein the first arrays and the second arrays are connected in reverse parallel to each other,
   wherein a magnitude of a driving voltage of each of the first arrays is defined as Vd1, a magnitude of a driving voltage of each of the second arrays is defined as Vd2, and a difference between Vd1 and Vd2×(n/m) is more than 0 and less than or equal to $\frac{2}{3} \times (Vd1+Vd2)/(n+m)$,
   wherein n and m are natural numbers, and
   wherein the magnitude of the driving voltage of each array is at least about 50V and refers to a magnitude of voltage applied to opposite ends of the corresponding array when a predetermined amount of driving current flows in the corresponding array.

9. The LED package according to claim 8, further comprising: a phosphor to convert a wavelength of light emitted from the first LED chip and the second LED chip.

10. The LED package according to claim 8, further comprising: a phosphor to convert a wavelength of light emitted from the first LED chip and the second LED chip.

* * * * *